(12) United States Patent
Chamberlin et al.

(10) Patent No.: US 7,052,625 B2
(45) Date of Patent: May 30, 2006

(54) SLURRY AND USE THEREOF FOR POLISHING

(75) Inventors: Timothy Scott Chamberlin, Fairfax, VT (US); Michael J. MacDonald, Yorktown Heights, NY (US); Mark P. Murray, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 736 days.

(21) Appl. No.: 09/819,787

(22) Filed: Mar. 28, 2001

(65) Prior Publication Data

US 2001/0013506 A1     Aug. 16, 2001

Related U.S. Application Data

(62) Division of application No. 09/122,015, filed on Jul. 24, 1998, now abandoned.

(51) Int. Cl.
*B44C 1/22*       (2006.01)
(52) U.S. Cl. .................... 216/88; 216/89; 438/693; 252/79.1; 252/79.4
(58) Field of Classification Search ............... 218/88, 218/89; 438/693; 252/79.1, 79.4; 216/88, 216/89
See application file for complete search history.

(56) References Cited

U.S. PATENT DOCUMENTS

| | | | | |
|---|---|---|---|---|
| 5,527,423 A | * | 6/1996 | Neville et al. | 438/693 |
| 5,770,103 A | * | 6/1998 | Wang et al. | 252/79.1 |
| 5,804,513 A | * | 9/1998 | Sakatani et al. | 438/693 |
| 5,968,280 A | * | 10/1999 | Ronay | 134/2 |
| 6,083,840 A | * | 7/2000 | Mravic et al. | 438/693 |
| 2002/0111024 A1 | * | 8/2002 | Small et al. | 438/689 |

FOREIGN PATENT DOCUMENTS

WO          95/24054      *   9/1995

* cited by examiner

*Primary Examiner*—Shamim Ahmed
(74) *Attorney, Agent, or Firm*—Connolly, Bove, Lodge & Hutz, LLP; Robert M. Trepp

(57) ABSTRACT

A slurry containing abrasive particles, an oxidizing agent having a low static etch rate on at least one acid or salt metal, and having a pH of about 5 to about 11 is especially useful for polishing surfaces, including both metal and silicon dioxide, such as present in microelectronics, at the same or substantially the same polishing rates.

20 Claims, No Drawings

SLURRY AND USE THEREOF FOR POLISHING

CROSS-REFERENCE TO RELATED APPLICATION

This is a divisional application of application Ser. No. 09/122,015, filed Jul. 24, 1998, now abandoned, entitled "Slurry and Use Thereof for Polishing".

TECHNICAL FIELD

The present invention is concerned with slurry compositions that are especially suitable for polishing surfaces. The present invention finds particular applicability in microelectronics. Moreover, the present invention can also be used for other substrates. The slurries of the present invention are capable of polishing both metal and silicon dioxide at substantially equal rates.

BACKGROUND OF THE INVENTION

In the manufacture of a semiconductor device, the wires for the chip in the "back end of the line" (BEOL) are usually formed by the so-called cloisonné process. In this process, the metal is uniformly deposited on the wafer, patterned with a mask, and then etched with a plasma reactive ion etch (RIE) tool to leave the metal isolated in regions where one desires the wires. Then the dielectric material is deposited, and polished using chemical mechanical planarization (CMP) to leave the conductors properly separated. One of the benefits of this process of forming the wires is that since the plasma RIE removes material on a "line of sight", it is effective in removing the metal that might be deposited in topography that originated from a process operation at a prior level.

However, to both reduce costs and to utilize different, lower resistance materials for the construction of the metal wires, the cloisonné process is being replaced by the damascene process to form the wires in the BEOL. In this reverse process, the dielectric is first uniformly deposited, patterned with a mask and etched. Then the metal conductor is uniformly deposited such that it forms a conformal film over the entire wafer and fills the patterns that have been etched into the dielectric. Then, using CMP, the excess surface metal is removed to leave the wires filled with metal. One of the problems with this process is that since the metal is removed via CMP, which planarizes as it removes the excess material, residual metal can remain in topography that has been created at prior levels. That is, if there is a scratch or erosion in the dielectric, the metal will fill that void and cannot be removed easily via CMP without considerable overpolish and the resulting damage that it introduces.

A specific example of where this change in methodology of creating the wiring is necessary is the manufacture of semiconductor devices with copper BEOL wiring. Since there is no viable RIE process for etching copper currently available, it is the preferred technique to form the lines with the damascene process. In such a case, the local wiring of the semiconductor devices (that is at the lowest levels of the chip) usually utilizes tungsten as the conductor, which is then connected to the more global wiring in the BEOL which is made of copper. In this specific example, it is found that erosion or scratching of the oxide dielectric at the last tungsten level replicates up into the ensuing copper levels. The areas of erosion then lead to "puddles" of residual copper and the scratches leave "stringers" of the copper, each of which if not removed at the copper CMP step, would cause short-circuits. If these puddles or stringers are removed during the copper CMP step, it adds considerable processing time for the "overpolish".

Since the removal of all of the surface metal is essential to eliminate these short circuits, and because the damascene process is sensitive to both the material and underlying topography of those materials, it is clear that the surface of the wafer must be highly planar (i.e. no existing topography) prior to the deposition of the metal. The obvious method of achieving this planarity is to polish the dielectric into which the metal will be inlaid to create a smooth, scratch-free film prior to metal deposition. However, this has the disadvantage that it would necessitate additional process steps (polishing and cleaning) and would result in a highly variable dielectric, and hence, conductor thickness. This would cause the undesirable result of having a variable resistance for the circuit.

SUMMARY OF INVENTION

The present invention overcomes problems in the prior art. More particularly, the present invention provides a slurry composition that is capable of removing the topography and scratches created during the polish of a prior level of metallization. The slurry composition of the present invention can polish both metal and silicon dioxide at equal or substantially equal rates.

The slurry composition of the present invention comprises abrasive particles and an oxidizing agent having a static etch rate on metal of less than 1000 Å/hour. The slurry composition of the present invention also has a pH of about 5 to about 11.

The present invention is also concerned with a method for polishing a surface. The method of the present invention comprises providing on the surface to be polished, a slurry of the type disclosed above. The surface is then polished by contacting the surface having the slurry thereon with a polishing pad. By using this slurry, the residual surface metal is removed, as well as dielectric surrounding it, creating a highly planar surface both locally and across the wafer.

Still other objects and advantages of the present invention will become readily apparent to those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various apparent respects, without departing from the invention. Accordingly, the description is to be regarded as illustrative in nature and not as restrictive.

BEST AND VARIOUS MODES FOR CARRYING OUT INVENTION

According to the present invention, a slurry comprising abrasive particles and an oxidizing agent having a very low or self-limiting static etch rate on metal is provided. The oxidizing agent has a static etch rate on metal of less than 1000 Å/hour, preferably less than 200 Å/hour and most preferably 0 Å/hour. Moreover, the oxidizing agent in conjunction with the abrasive material typically provides for polishing of metals such as tantalum, tungsten and titanium and their nitrides at rates of greater than 200 Å/min. and preferably at least 500 Å/min. In addition, the pH of the slurry according to the present invention is about 5 to about 11.

Examples of suitable oxidizing agents employed according to the present invention are potassium iodate, sodium iodate, ammonium cerium nitrate and potassium ferricyanide. The potassium iodate is preferred because it is pH-neutral when dissolved in a slurry. Therefore, the pH of the slurry can be easily adjusted with a strong acid or base.

Typically, the oxidizing agent is present in the slurry in amounts of about 1 g/L to about 100 g/L and more typically about 10 g/L to about 40 g/L.

The abrasive particles employed include those conventionally used in polishing slurries. Examples of suitable abrasive particles include alumina, silica, including both colloidal silica and fumed silica, ferric oxide, zirconia, ceria, and titanium dioxide and mixtures thereof. The abrasive particles typically have a particle size of about 10 to about 1000 nanometers and preferably about 50 to about 200 nanometers. The amount of abrasive particles is typically about 0.2 to about 30% by weight and more typically about 5% to about 20% by weight. Also, the slurry is preferably an aqueous slurry. Other types of suitable slurries include those using as the diluent organic solvents such as propylene carbonate and mono and polyhydric alcohols such as methanol, ethanol, ethylene glycol and glycerol. Of course, mixtures of these diluents as well as mixtures with water can be used when desired.

The slurry compositions of the present invention have a pH of about 5 to about 11, and preferably a pH of about 7 to about 9. When necessary, the pH can be adjusted by adding the needed amount of a base such as potassium hydroxide, sodium hydroxide, ammonium hydroxide and/or mineral acid such as nitric acid, sulfuric acid and phosphoric acid.

In addition, if desired, the slurry compositions can contain conventional auxiliary components such as corrosion inhibitors and agents for promoting cleaning of residual materials. Some typical auxiliary agents include surfactants such as cationic, anionic, non-ionic and mixtures; and polymers such as polymers of ethylene oxide, polymers of acrylic acid, polymers of acrylamide, polymers of vinyl alcohol, copolymers thereof and mixtures thereof. When present, the surfactants are typically employed in amounts of about 0.1 g/L to about 10 g/L. When present, the polymers are typically in amounts of about 0.1 g/L to about 10 g/L. The polymers can help in suspending particles in the slurry and keep them from sticking to the wafer after polishing.

The parameters of the polishing or planarizing can be determined by those skilled in the art once aware of this disclosure, without exercising undue experimentation. For instance, the speed of rotation of the polishing pads is about 10 to about 150 rpm, and the speed of the rotation of the wafer carrier is about 10 to about 150 rpm and the down force about 2 to about 10 psi. The polishing pads are those conventionally used in polishing for microelectronics.

Surfaces that can be polished according to the present invention include silicon dioxide, aluminum, copper, tungsten and refractory metals such as niobium, tantalum and titanium and their nitrides.

Slurry compositions of the present invention are capable of polishing metal and silicon dioxide at the same or at least substantially the same rates, typically at a ratio of polishing rates of metal to silicon dioxide of 1:2 to 2:1 using a soft polishing pad typically used in polishing semiconductors such as a soft polyurethane polishing pad.

A particular use of the slurry of the present invention is for the second step in the two-step damascene metal polish process that is known to those familiar with the art. In the first step, one removes the metal such as tungsten with a highly acidic slurry with a strong oxidizing agent (such as ferric nitrate or hydrogen peroxide). However, the second step of the process utilizes the slurry of this invention which polishes both the metal and dielectric at substantially the same rate to leave the resulting surface highly planar.

This differs significantly from the slurries that are presently utilized for either tungsten or oxide polishing. The slurries that are used for tungsten polishing are generally specifically formulated to not polish the dielectric; that is, they are selective to the oxide. Generally, they are acidic, employing aluminum oxide as the abrasive, having a pH in the range of 1 to 4, and containing a strong oxidizer such as ferric nitrate, ammonium persulfate or hydrogen peroxide in concentrations that will maximize the polishing rate of the tungsten. When utilized to reduce topography for this application, these slurries leave the surface scratched, with the tungsten conductors considerably recessed. In contrast, use of a typical oxide slurry, which is generally a silica particle with pH in the range of 10 to 12, eliminates the scratches caused by the primary slurry, but is highly selective to the tungsten. That is, it does not polish the tungsten. Thus, by the time that the scratches and erosion are eliminated by this polishing slurry, the tungsten is protruding above the dielectric by an amount that is equivalent to the amount of oxide removed.

As shown in Table 1 below, the ratio of these rates varies considerably for the specific metal/dielectric combination of tungsten and boron-phosphorus doped silicate glass (BPSG). This feature of the slurry is a considerable advantage over slurries which use ferric nitrate, a strong acid in solution, as oxidizer for this application. In addition, the slurry neither settles nor solidifies into a gel, which is a considerable advantage over using an oxidizer such as ammonium persulfate. Finally, the slurry has a self-limiting static etch rate, which prevents unwanted chemical etching of the metal. Slurries which use hydrogen peroxide and ammonium persulfate do etch the metal considerably, and hence, pose the risk of inadvertently removing all the metal if special precautions are not taken.

TABLE 1

| pH | Tungsten Rate (A/min) | BPSG Rate (A/min) | Rate Selectivity (W:BPSG) |
| --- | --- | --- | --- |
| 10 | 160 | 2500 | 0.06 |
| 8 | 200 | 2400 | 0.08 |
| 6 | 540 | 590 | 0.91 |
| 4 | 785 | 257 | 3.05 |

As illustrated in Table 1, the use of the composition at a pH of 6 is preferred for this particular example.

According to a further use of the slurry of the present invention, the thin adhesion-promoting, or diffusion-preventing materials that comprise the "liner" can be removed. It is well known to those familiar in the art, that depositing metal in the damascene process can be successfully accomplished in some situations by using a two step CMP process whereby in the first step, the conductor is removed and in the second step, the liner material (which may or may not be a conductor) is removed. In this embodiment, it is found that the primary polish of the conductor is accomplished with a slurry and process that is selective to the liner material. Then in the second polish step, the liner is removed with an alternate slurry process. According to the present invention, it is found to be preferable to use the slurry composition described above (silica, potassium iodate, pH adjusted to between 5 and 11) to remove the liner.

A specific example of this embodiment is in the polishing of either tungsten or aluminum where the liner material is either titanium or tantalum (or nitrides thereof). In this embodiment it is found that the slurry removes the liner, and polishes the dielectric and the conductor concurrently without causing scratching, erosion or dishing.

The foregoing description of the invention illustrates and describes the present invention. Additionally, the disclosure shows and describes only the preferred embodiments of the invention, but as mentioned above, it is to be understood that the invention is capable of use in various other combinations, modifications and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for polishing both metal and dielectric material at substantially the same polishing rate, comprising:
   providing on said metal and dielectric material a slurry consisting essentially of abrasive particles and an oxidizing agent wherein said oxidizing agent has a static etch rate on metal of less than 1000Å per hour; and wherein the pH of the slurry is about 5 to about 11;
   and polishing said metal and dielectric material by contacting it with a polishing pad.

2. The method of claim 1 wherein said oxidizing agent is present in the composition in amounts of about 1 g/L to about 100 g/L.

3. The method of claim 1 wherein said abrasive particles are present in the composition in amounts of about 0.2 to about 30% by weight.

4. The method of claim 1 wherein said oxidizing agent is selected from the group consisting of potassium iodate, sodium iodate and ammoniun cerium nitrate, and potassium ferricyanide.

5. The method of claim 1 wherein said oxidizing agent comprises potassium iodate.

6. The method of claim 1 wherein said abrasive particles are selected from the group consisting of alumina, silica, zirconia, ceria, titanium dioxide, ferric oxide and mixtures thereof.

7. The method of claim 1 wherein said abrasive particles have a particle size of about 10 to about 1000 nanometers.

8. The method of claim 1 wherein said abrasive particles include silica.

9. The method of claim 1 wherein said slurry is an aqueous slurry.

10. The method of claim 9 wherein said slurry further contains an organic diluent.

11. The method of claim 10 wherein said organic diluent is selected from the group consisting of propylene carbonate, methanol, ethanol, ethylene glycol, glycerol and mixtures thereof.

12. The method of claim 1 wherein said slurry contains an organic diluent.

13. The method of claim 12 wherein said organic diluent is selected from the group consisting of propylene carbonate, methanol, ethanol, ethylene glycol, glycerol and mixtures thereof.

14. The method of claim 1 wherein the ratio of polishing rates of said metal to said dielectric material is about 1:2 to about 2:1.

15. The method of claim 1 wherein said polishing involves the step of metal CMP which immediately precedes deposition of the next level dielectric for the purpose of removing scratches or reducing the effects of erosion on dense contact pattern areas or both.

16. The method of claim 1 wherein said polishing comprises removing an adhesion promoting or diffusion barrier layer.

17. The method of claim 16 wherein said adhesion promoting or diffusion barrier layer is at least one material selected from the group consisting of titanium, titanium nitride, tantalum and tantalum nitride.

18. The method of claim 14 wherein said metal is selected from the group consisting of aluminum, copper and tungsten and said dielectric is silicon dioxide.

19. The method of claim 1 wherein the speed of said pad during said polishing is about 10 to about 150 rpm, and the speed of the wafer carrier is about 10 to about 150 rpm.

20. The method of claim 7 wherein said abrasive particles include silica.

* * * * *